United States Patent
Park et al.

(10) Patent No.: US 7,977,783 B1
(45) Date of Patent: Jul. 12, 2011

(54) WAFER LEVEL CHIP SIZE PACKAGE HAVING REDISTRIBUTION LAYERS

(75) Inventors: No Sun Park, Seoul (KR); Young Suk Chung, Seoul (KR); Jae Beom Shim, Incheon (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/549,083

(22) Filed: Aug. 27, 2009

(51) Int. Cl.
*H01L 23/48* (2006.01)

(52) U.S. Cl. ......... 257/692; 257/E29.325; 257/E23.023; 257/E23.124; 257/E23.069; 257/737; 257/738

(58) Field of Classification Search ............. 257/692, 257/737, 738, E29.325, E23.023, E23.124, 257/E23.069
See application file for complete search history.

(56) References Cited

U.S. PATENT DOCUMENTS

| | | | |
|---|---|---|---|
| 7,211,893 B2* | 5/2007 | Alter et al. | 257/738 |
| 7,466,031 B2 | 12/2008 | Huang | |
| 7,468,545 B2* | 12/2008 | Lin et al. | 257/622 |
| 7,701,056 B2* | 4/2010 | Su | 257/737 |
| 7,767,496 B2* | 8/2010 | Shim et al. | 438/118 |
| 2005/0121770 A1* | 6/2005 | Baek et al. | 257/698 |
| 2006/0226542 A1* | 10/2006 | Chien et al. | 257/737 |
| 2007/0152327 A1* | 7/2007 | Chia et al. | 257/723 |
| 2007/0176290 A1* | 8/2007 | Park et al. | 257/737 |
| 2007/0296065 A1* | 12/2007 | Yew et al. | 257/659 |
| 2008/0042259 A1* | 2/2008 | Yamaguchi | 257/700 |
| 2008/0211093 A1* | 9/2008 | Ke et al. | 257/738 |
| 2009/0057895 A1* | 3/2009 | Lin et al. | 257/737 |

* cited by examiner

*Primary Examiner* — Alexander O Williams
(74) *Attorney, Agent, or Firm* — Gunnison, McKay & Hodgson, L.L.P.; Serge J. Hodgson

(57) ABSTRACT

A wafer level chip size package (WLCSP) and a method of manufacturing the same are disclosed. Lands are formed at the ends of redistribution layers. The redistribution layers excluding the lands and a first dielectric layer are covered with a second dielectric layer. After forming a first under bump metallurgy (UBM) layer on the land, a solder ball is reflowed to the first UBM layer. A second UBM layer is widely formed on the entire second dielectric layer that is the outer circumference of the first UBM layer and is connected to the redistribution layer through a via-hole. Therefore, the second UBM layer having a large area can be used as a ground plane or a power plane. In addition, the second UBM layer can electrically connect the redistribution layers physically separated from each other. Therefore, the plurality of redistribution layers can cross each other without being electrically shorted with each other.

16 Claims, 13 Drawing Sheets

WAFER LEVEL CHIP SIZE PACKAGE HAVING REDISTRIBUTION LAYERS

BACKGROUND OF THE INVENTION

1. Field of the Invention

The present invention relates to a wafer level chip size package (WLCSP) and a method of manufacturing the same.

2. Description of the Related Art

A desire to make electronic products small, light, and have high performance develops into a desire to make electronic parts small, light, and have high performance. Such a desire causes development in various packaging technologies with development in technologies of designing and manufacturing semiconductors. The representative examples of the packaging technologies are ball grid array (BGA), flip-chip, and chip size package (CSP) based on area array and a surface-mount packaging. Among the above, the CSP is a packaging technology spotlighted by enabling a small package having a size the same as a real chip size to be developed. In particular, in a wafer level chip size package (WLCSP), the packaging is performed in a wafer level so that packaging costs per a chip can be remarkably reduced.

The WLCSP includes a redistribution layer (RDL) wiring traces, an under bump metallurgy (UBM) layer forming a bump, and a passivation layer protecting a circuit.

In the WLCSP, since only the RDL layer is actually used to form a circuit, when it is necessary to constitute a complicated circuit, two or more RDL layers are required. Therefore, since the number of passivation layers is to be increased, the packaging becomes very complicated and manufacturing costs increase.

BRIEF SUMMARY OF THE INVENTION

A wafer level chip size package (WLCSP) and a method of manufacturing the same are disclosed. Lands are formed at the ends of redistribution layers. The redistribution layers excluding the lands and a first dielectric layer are covered with a second dielectric layer. After forming a first under bump metallurgy (UBM) layer on the land, a solder ball is ref lowed to the first UBM layer. A second UBM layer is widely formed on the entire second dielectric layer that is the outer circumference of the first UBM layer and is connected to the redistribution layer through a via-hole. Therefore, the second UBM layer having a large area can be used as a ground plane or a power plane. In addition, the second UBM layer can electrically connect the redistribution layers physically separated from each other. Therefore, the plurality of redistribution layers can cross each other without being electrically shorted with each other.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same or similar elements.

DETAILED DESCRIPTION OF THE INVENTION

Figure 1:
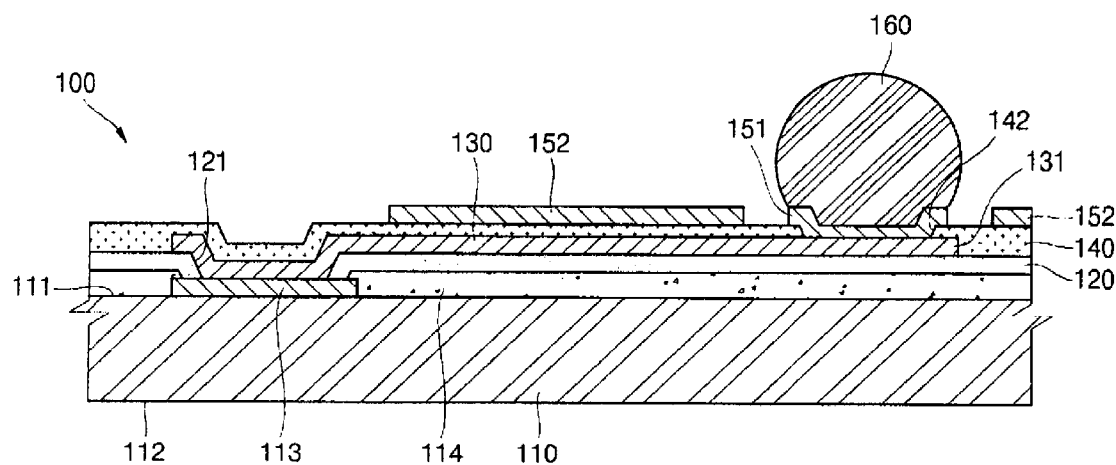
FIG. 1 is a sectional view illustrating a wafer level chip size package (WLCSP) according to an embodiment of the present invention.

Referring to FIG. 1, a sectional view of a wafer level chip size package (WLCSP) 100 according to an embodiment of the present invention is illustrated.

As illustrated in FIG. 1, the WLCSP 100 according to the embodiment of the present invention includes a semiconductor die 110, a first dielectric layer 120, a redistribution layer 130, a second dielectric layer 140, a first under bump metallurgy (UBM) layer 151, a second UBM layer 152, and a solder ball 160.

The semiconductor die 110 includes a first approximately planar surface 111 and a second approximately planar surface 112 as the opposite surface of the first surface 111. The semiconductor die 110 includes at least one bond pad 113, which can be formed on the first surface 111. Furthermore, a passivation layer 114 can be formed on the first surface 111 that is the outer circumference of the bond pad 113. The passivation layer 114 can be made of one selected from the group of PolyImide (PI), Benzo Cyclo Butene (BCB), Poly Benz Oxazole (PBO), BismaleimideTriazine (BT), phenolic resin, epoxy, Silicone, an oxide layer ($SiO_2$), a nitride layer ($Si_3N_4$), and their equivalents, but the material of the passivation layer 114 is not limited thereto.

The first dielectric layer 120 is formed on the passivation layer 114 to a preset thickness. That is, the first dielectric layer 120 has a first opening 121 formed in the region corresponding to the bond pad 113 and covers the passivation layer 114. The first opening 121 exposes the bond pad 113. The first dielectric layer 120 can be made of one selected from the group of PolyImide (PI), Benzo Cyclo Butene (BCB), Poly Benz Oxazole (PBO), BismaleimideTriazine (BT), phenolic resin, epoxy, Silicone, an oxide layer ($SiO_2$), a nitride layer ($Si_3N_4$), and their equivalents, but the material of the first dielectric layer 120 is not limited thereto. Furthermore, the first dielectric layer 120 can be formed to a thickness of about 3 to 15 micrometers. When the thickness of the first dielectric layer 120 is smaller than 3 micrometers, efficiency of absorbing and buffering the mechanical stress transmitted from an external apparatus to the solder ball deteriorates. On the other hand, when the thickness of the first dielectric layer 120 exceeds 15 micrometers, the thickness of the WLCSP 100, sometimes called a semiconductor device, excessively increases.

The redistribution layer 130 is configured such that one end, sometimes called a first end, is electrically connected to the bond pad 113 and the other end, sometimes called a second end, extends onto the first dielectric layer 120 by a preset length. A land 131 is formed in the redistribution layer 130 at the second end on the first dielectric layer 120. That is, the approximately circular land 131 is formed at the end of the redistribution layer 130 on a plane. The redistribution layer 130 re-arranges the position of the peripheral bond pad 113 in the form of a lattice. The redistribution layer 130 can be made of titanium tungsten (Ti/W) and copper (Cu), the present invention is not limited to the materials. Actually, the titanium tungsten serves as a seed layer of plating the copper thick during the manufacturing of semiconductors and of securely bonding the copper to the second dielectric layer 140.

The second dielectric layer 140 is formed on the redistribution layer 130 and the first dielectric layer 120 where the redistribution layer 130 is not formed to a preset thickness. A second opening 142 is formed in the second dielectric layer 140 such that the land 131 in the redistribution layer 130 is exposed through the second opening 142. The second dielectric layer 140 covers the redistribution layer 130 to prevent the redistribution layer 130 from being oxidized and contaminated. The second dielectric layer 140 can be made of one selected from the group of PolyImide (PI), Benzo Cyclo Butene (BCB), Poly Benz Oxazole (PBO), BismaleimideTriazine (BT), phenolic resin, epoxy, silicone, an oxide layer ($SiO_2$), a nitride layer ($Si_3N_4$), and their equivalents, but the material of the second dielectric layer 140 is not limited thereto. Furthermore, the second dielectric layer 140 can also be formed to a thickness of about 3 to 15 micrometers. When the thickness of the second dielectric layer 140 is smaller than 3 micrometers, efficiency of absorbing and buffering the mechanical stress transmitted from the external apparatus to the solder ball deteriorates. On the other hand, when the thickness of the second dielectric layer 140 exceeds 15 micrometers, the thickness of the WLCSP 100 excessively increases.

The first UBM layer 151 is formed on the land 131 exposed through the second opening 142 of the second dielectric layer 140. The first UBM layer 151 can be formed by sequentially laminating titanium (Ti), copper (Cu), nickel (Ni), and gold (Au) on the land 131, but the present invention is not limited to the materials. The first UBM layer 151 allows the solder ball 160 to easily reflow to the land 131 in the redistribution layer 130 and prevents the solder ball 160 from being diffused into the land 131. For example, the titanium serves as a bonding layer, the nickel serves as a diffusion preventing layer, and the gold is a wettable layer.

The second UBM layer 152 is formed on the second dielectric layer 140 around the outer circumference of the first UBM layer 151. The second UBM layer 152 is spaced apart and electrically isolated from the first UBM layer 151 not to be shorted with the solder ball 160, i.e., is electrically isolated from the solder ball 160. The second UBM layer 152 is formed of the same material and in the same method as those of the first UBM layer 151. The second UBM layer 152 covers most of the second dielectric layer 140. Thus, the second UBM layer 152 can serve as a ground plane or a power plane, e.g., is coupled to a ground source or a power source, respectively. The second UBM layer 152 covers most of the second dielectric layer 140 to prevent electromagnetic waves, generated by the redistribution layer 130 lower than the second dielectric layer 140, from being emitted to the outside and to prevent electromagnetic waves in the outside from reaching the redistribution layer 130. The second UBM layer 152 is thus sometimes called a shield layer for shielding the redistribution layer 130. In one embodiment, the second UBM layer 152 is electrically connected to another bond pad 113 or another land 131 to serve as a ground plane or a power plane, which will be described in detail later. The second UBM layer 152 provides the detour route for the redistribution layer 130. In other words, the second UBM layer 152 also enables different redistribution layers to cross each other without electrical shorting, which will be described in detail later. The second UBM layer 152 rapidly removes heat generated by the semiconductor die 110.

The solder ball 160 is reflowed onto the first UBM layer 151 in the form of an approximately sphere. The solder ball 160 transmits electrical signals between the semiconductor die 110 and the external apparatus. The solder ball 160 can be made of one selected from the group of Sn—Pb, Sn—Pb—Ag, Sn—Pb—Bi, Sn—Cu, Sn—Ag, Sn—Bi, Sn—Ag—Cu, Sn—Ag—Bi, Sn—Zn, and their equivalents, but the material of the solder ball 160 is not limited thereto.

Figure 2:
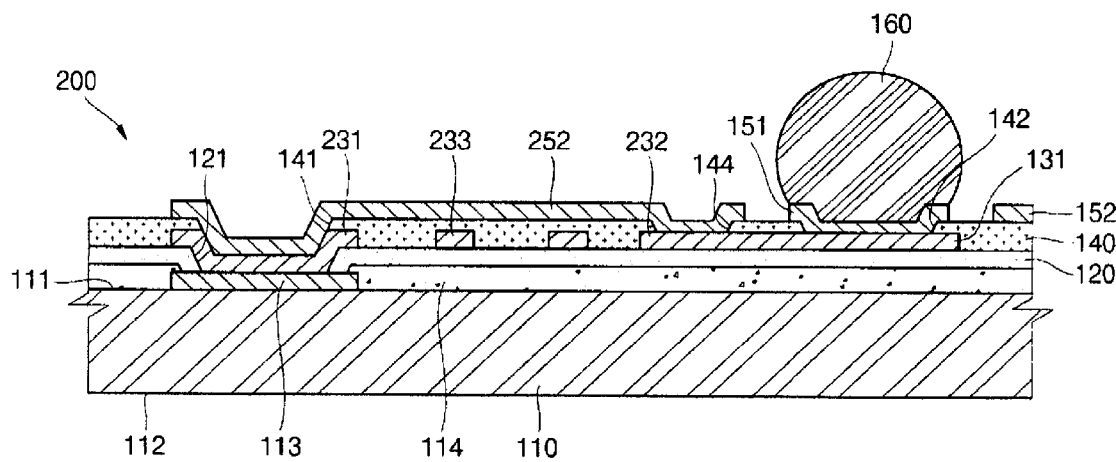
FIG. 2 is a sectional view illustrating a WLCSP according to another embodiment of the present invention.

Referring to FIG. 2, a sectional view of a WLCSP 200 according to another embodiment of the present invention is illustrated.

As illustrated in FIG. 2, a WLCSP 200 according to another embodiment of the present invention is similar to the WLCSP 100 illustrated in FIG. 1. Therefore, the WLCSP 200 will be described by concentrating on a difference between the two WLCSPs.

As illustrated in FIG. 2, redistribution layers are physically separated from each other by a preset distance. That is, the redistribution layers include a first redistribution layer 231 connected to a bond pad 113 and a second redistribution layer 232 including land 131, which are physically separated from each other.

On the other hand, a second UBM layer 252 is connected to the bond pad 113 and the land 131. That is, the second UBM layer 252 electrically connects the bond pad 113 and the land 131. In other words, an opening 141 is formed in the region corresponding to the first redistribution layer 231 connected to the bond pad 113 in the second dielectric layer 140 and one end of the second UBM layer 252 is connected to the first redistribution layer 231 through the opening 141. The opening 141 is formed directly over the bond pad 113. Actually, the second UBM layer 252 is connected to the first redistribution layer 231 positioned on the bond pad 113. A via-hole 144 is formed in the region corresponding to the second redistribution layer 232 connected to the land 131 in the second dielectric layer 140 and the other end of the second UBM layer 252 is connected to the second redistribution layer 232 through the via-hole 144. Thus, the second UBM layer 252 electrically connects the first redistribution layer 231 connected to the bond pad 113 and the second redistribution layer 232 connected to the land 131 to each other. Openings 141, 142 are sometimes called a first redistribution layer opening 141 and a land opening 142, respectively.

A third redistribution layer 233 that is not electrically connected to, i.e., is electrically isolated from, the first redistribution layer 231 and the second redistribution layer 232 is formed on a first dielectric layer 120 below the second UBM layer 252. That is, the first and second redistribution layers 231 and 232 and the third redistribution layer 233 cross each other without electrical shorting. Second dielectric layer 140 is between the third redistribution layer 233 and the second UBM layer 252 and electrically isolates the third redistribution layer 233 and the second UBM layer 252 from each other.

When the second UBM layer 252 is designed as the ground plane or the power plane, all of the solder balls 160 connected to the second UBM layer 252 through the second redistribution layer 232 can serve as GROUNDs or POWERs. That is, according to the present invention, although the solder balls 160 serving as GROUNDs or POWERs are scattered in various positions, the solder balls 160 can be connected to GROUND or POWER in a simple structure. Therefore, according to the present invention, the electrical performance of the WLCSP 200 can be improved and heat emission performance thereof is improved due to the structure of the second UBM layer 252 formed in a wide region.

Figure 3:
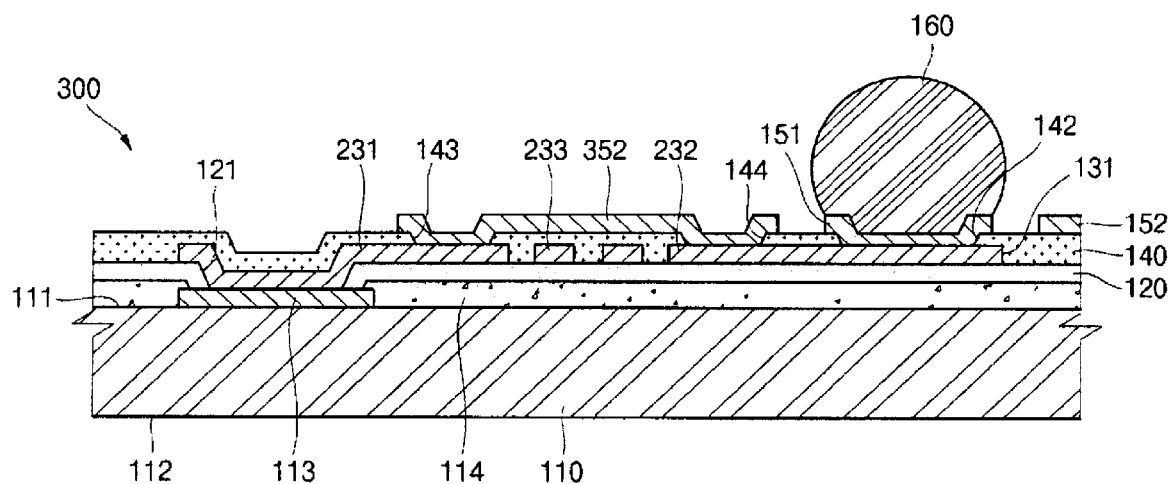
FIG. 3 is a sectional view illustrating a WLCSP according to still another embodiment of the present invention.

Referring to FIG. 3, a sectional view of a WLCSP 300 according to still another embodiment of the present invention is illustrated.

As illustrated in FIG. 3, a WLCSP 300 according to still another embodiment of the present invention is similar to the WLCSP 200 illustrated in FIG. 2. Therefore, the WLCSP 300 will be described by concentrating on a difference between the two WLCSPs.

A via-hole 143, sometimes called a first redistribution layer opening 143, is formed in the region corresponding to a first redistribution layer 231 connected to a bond pad 113 in a second dielectric layer 140, and a via-hole 144 is formed in the region corresponding to a second redistribution layer 232 connected to a land 131 in the second dielectric layer 140. Here, the via-hole 143 is not formed directly over the bond pad 113 but over an extension of the first redistribution layer 231.

One end of a second UBM layer 352 is connected to the first redistribution layer 231 through the via-hole 143 and the other end of the second UBM layer 352 is connected to the second redistribution layer 232 through the via-hole 144. Therefore, the second UBM layer 352 electrically connects the first redistribution layer 231 and the second redistribution layer 232 that are physically separated from each other.

The second UBM layer 352 can be linearly formed unlike the above-described second UBM layers 152 and 252. That is, the second UBM layer 352 does not cover the second dielectric layer 140 to form a plane but linearly connects the first redistribution layer 231 and the second redistribution layer 232 to each other. A third redistribution layer 233 that is not electrically connected to the first and second redistribution layers 231 and 232 can be provided below the linear second UBM layer 352 to cross the linear second UBM layer 352. The second UBM layer 352 allows the third redistribution layer 233 to be linearly formed instead of detouring so that the electrical performance of the WLCSP 300 can be improved to design redistribution layers 231, 232, and 233 more effectively. Therefore, the second UBM layer 352 is effective on a semiconductor die having many bond pads. That is, due to an effective connection between the redistribution layers and the UBM layers, the WLCSP 300 according to this embodiment of the present invention has the same effect as a multilayer redistribution layer.

Figure 4:
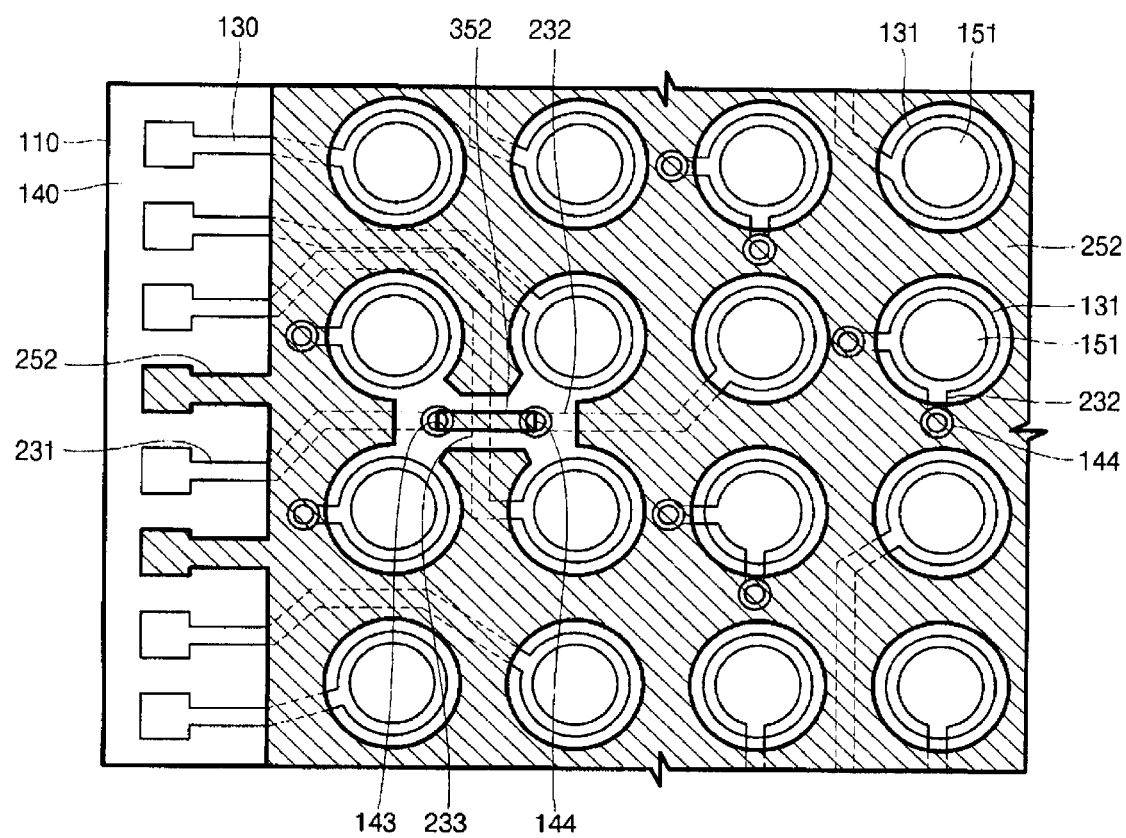
FIG. 4 is a plan view illustrating a WLCSP according to an embodiment of the present invention.

Referring to FIG. 4, a plan view of a WLCSP according to the embodiments of the present invention is illustrated As illustrated in FIG. 4, the above embodiments can be applied to a single WLCSP. For example, the second UBM layer 252 can be widely formed to cover most of the second dielectric layer 140 without being shorted with the first circular UBM layer 151. The second UBM layer 252 can be electrically connected to the first redistribution layer 231, a preset region of which is connected to the bond pad 113.

In this case, the second UBM layer 252 covering most of the second dielectric layer 140 can be used as a ground plane or a power plane. Therefore, all of the solder balls connected to the second UBM layer 252 through the via-hole 144 can be used as GROUND or POWER.

Moreover, unlike the second UBM layer 252, the linear second UBM layer 352 can electrically connect the first redistribution layer 231 and the second redistribution layer 232 to each other. One end of the first redistribution layer 231 and one end of the second UBM layer 252 are connected to each other through the via-hole 143 and the other end of the second redistribution layer 232 and the other end of the second UBM layer 252 are connected to each other through the via-hole 144. That is, the second UBM layer 252 electrically connects the cut off redistribution layers to each other. The third redistribution layer 233 can be provided below the second UBM layer 352 to cross the second UBM layer 352.

By doing so, in the WLCSP according to the embodiments of the present invention, the plane UBM layer serves as the GROUND or POWER of the overall WLCSP and the linear UBM layer serves as a signal line. In particular, due to the UBM layer serving as the signal line, a single redistribution layer can function as a multilayer redistribution layer.

Figure 5:
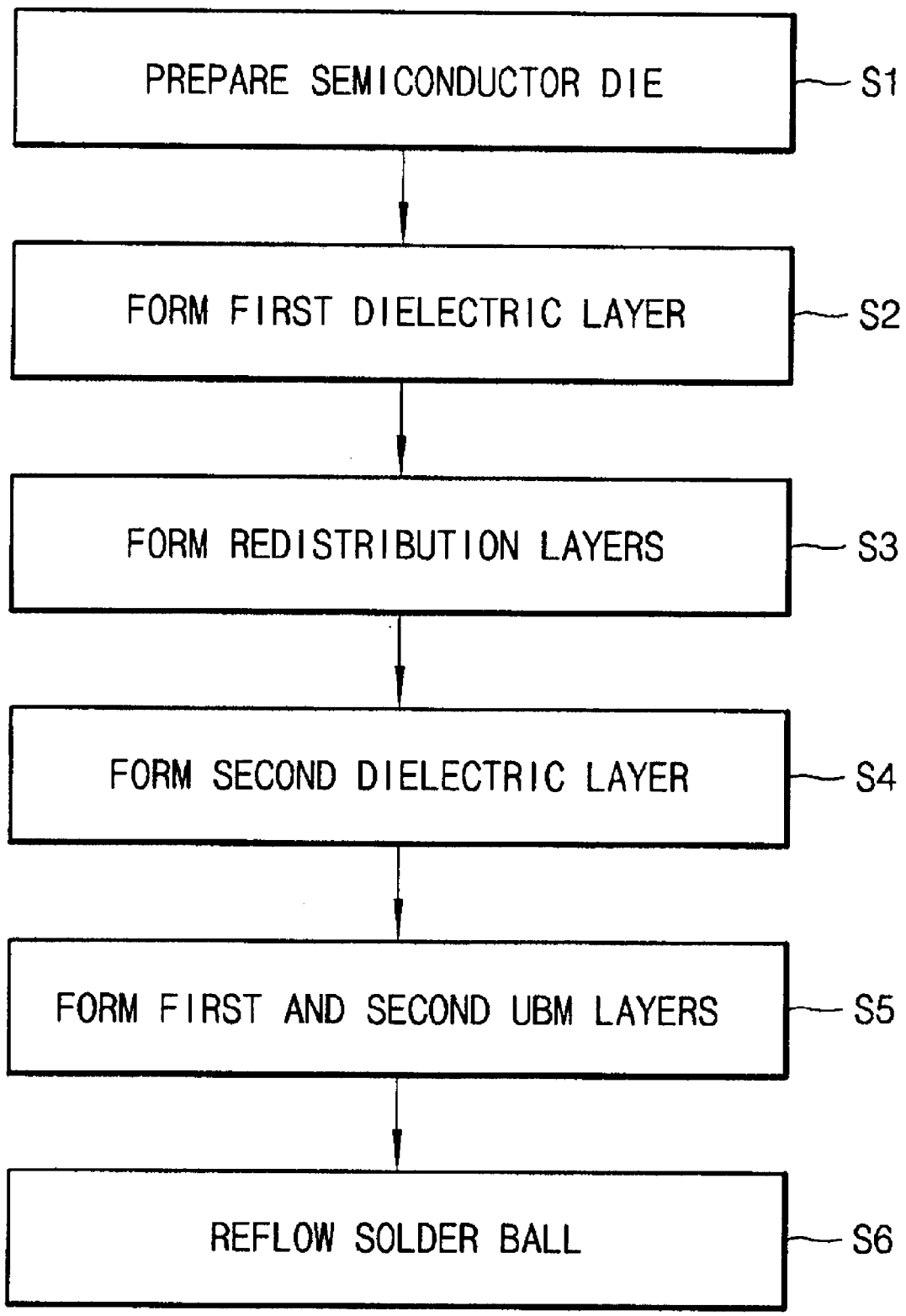
FIG. 5 is a flowchart illustrating a method of manufacturing a WLCSP according to an embodiment of the present invention.

Referring to FIG. 5, a method of manufacturing a WLCSP according to embodiments of the present invention is illustrated by a flowchart.

As illustrated in FIG. 5, the method of manufacturing a WLCSP according to the present invention includes a prepare semiconductor die operation S1, a form first dielectric layer operation S2, a form redistribution layers operation S3, a form second dielectric layer operation S4, a form first and second UBM layers operation S5, and a reflow solder ball operation S6.

Referring to FIGS. 6A to 6F, a method of manufacturing a WLCSP according to an embodiment of the present invention is illustrated by sectional views.

Figure 6A:
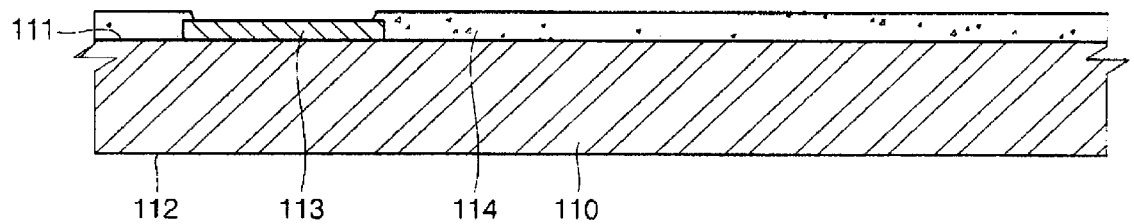
FIGS. 6A, 6B, 6C, 6D, 6E, 6F are sectional views sequentially illustrating a method of manufacturing a WLCSP according to an embodiment of the present invention.

As illustrated in FIG. 6A, in the prepare semiconductor die operation S1, a semiconductor die 110 having a first approximately planar surface 111 and a second approximately planar surface 112 that is the opposite surface of the first surface 111 and having at least one bond pad 113 formed on the first surface 111 is prepared. In this case, a passivation layer 114 of a preset thickness can be formed on the first surface 111 such that the bond pad 113 is exposed to the outside.

Figure 6B:
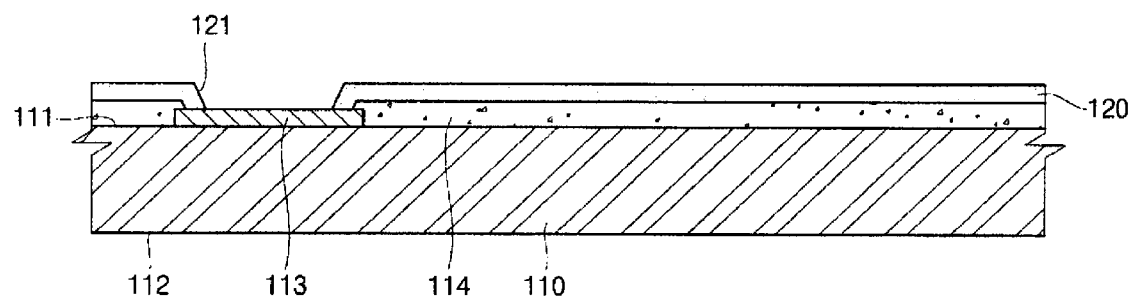

As illustrated in FIG. 6B, in the form first dielectric layer operation S2, a first opening 121 is formed in the region corresponding to the bond pad 113 and a first dielectric layer 120 of a preset thickness is formed to cover the entire passivation layer 114. For example, the first dielectric layer 120 of a preset thickness is formed by which a first liquid dielectric layer 120 is coated on the bond pad 113 and the passivation layer 114 by spin-coating, screen-printing, or dispensing, and by hardening the first liquid dielectric layer 120. Then, the first opening 121 is formed in the region corresponding to the bond pad 113 by sequentially coating, exposing, and developing photoresist and by etching the first dielectric layer 120 such that the bond pad 113 is exposed to the outside through the first dielectric layer 120.

Figure 6C:
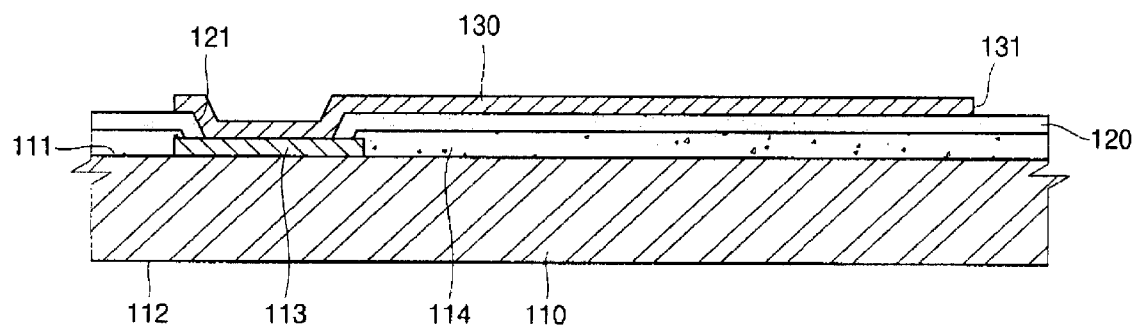

As illustrated in FIG. 6C, in the form redistribution layers operation S3, a redistribution layer 130 having one end connected to the bond pad 113 and having the other end extended onto the first dielectric layer 120 and including a circular land 131 is formed on a plane. To be specific, a seed layer is formed on the bond pad 113 and the first dielectric layer 120 of titanium tungsten (TiW). Then, a pattern is defined such that a desired region of the seed layer is exposed to the outside of the photoresist by coating, exposing, and developing the photoresist. Next, copper is plated relatively thick on the seed layer inside the pattern made of the photoresist to form the redistribution layer. Then, the photoresist and the seed layer outside the redistribution layer are all removed by etching. Since the seed layer, the photolithographing, and the etching are well known, the seed layer and the photolithographing and etching processes are not illustrated in the drawing.

Figure 6D:
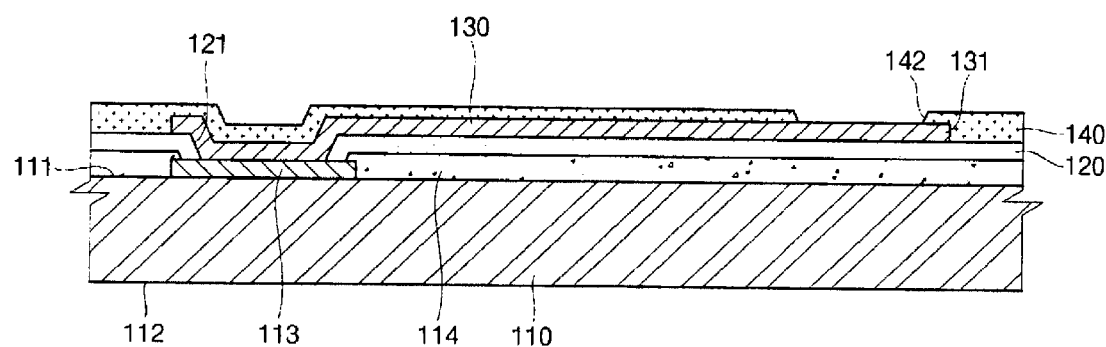

As illustrated in FIG. 6D, in the form second dielectric layer operation S4, a second dielectric layer 140 of a preset thickness is formed on the first dielectric layer 120 and the redistribution layer 130. For example, the second dielectric layer 140 of a preset thickness is formed by spin-coating, screen-printing, or dispensing a second liquid dielectric layer 140 and then by hardening the second liquid dielectric layer 140 on the first dielectric layer 120 and the redistribution layer 130. Then, a second opening 142 is formed in the region corresponding to the land 131 in the redistribution layer 130 by coating, exposing, and developing photoresist and by etching the second dielectric layer 140 such that the land 131 is exposed to the outside through the second dielectric layer 140.

Figure 6E:
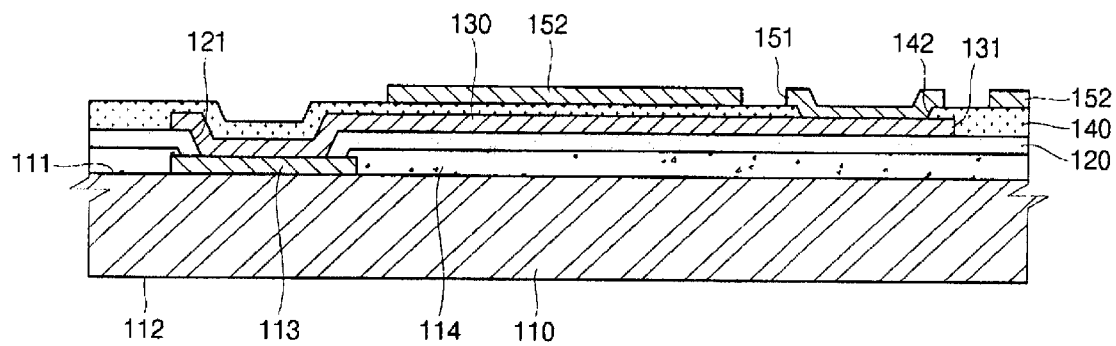

As illustrated in FIG. 6E, in the form first and second UBM layers operation S5, a first UBM layer 151 is formed on the land 131 exposed through the second opening 142 of the second dielectric layer 140 and a second plane UBM layer 152 is formed on the second dielectric layer 140 spaced apart from the first UBM layer 151. In this case, the second UBM layer 152 covers most of the second dielectric layer 140. The first and second UBM layers 151 and 152 can be formed by sequentially depositing titanium (Ti), copper (Cu), nickel (Ni), and gold (Au). For example, titanium as a seed layer is deposited on the entire surface of the second dielectric layer 140 and a pattern in which the first and second UBM layers 151 and 152 are formed is defined by coating, exposing, and developing the photoresist. Then, copper, nickel, and gold are sequentially plated on the defined region and the photoresist and Ti as the seed layer positioned outside the first and second UBM layers 151 and 152 are removed, so that the first and second UBM layers 151 and 152 are formed. In this case, the first and second UBM layers 151 and 152 are spaced apart from each other to prevent shorting therebetween.

By doing so, the first UBM layer 151 allows good connection of the solder ball to the redistribution layer 130 and the second UBM layer 152 shields electromagnetic waves. In particular, when the second UBM layer 152 is grounded, electromagnetic waves are shielded more effectively. Since the second UBM layer 152 is formed to have a large area, heat emission of the WLCSP can be activated more. When the second UBM layer 152 is connected to POWER, the second UBM layer 152 can be used as a common power plane.

Figure 6F:
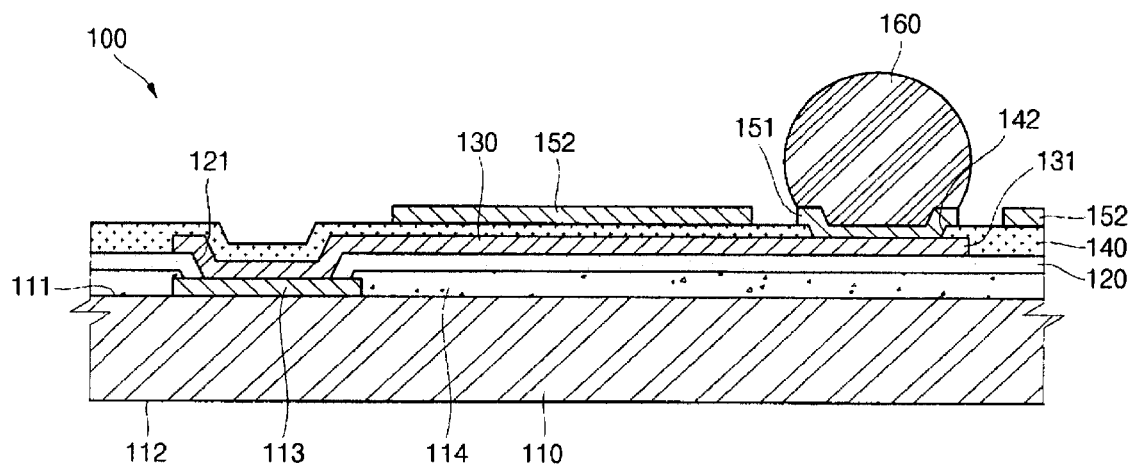

As illustrated in FIG. 6F, in the reflow solder ball operation S6, a solder ball 160 of a preset size is welded to the first UBM layer 151 to complete the WLCSP 100 according to the embodiments of the present invention. For example, first, the first UBM layer 151 is coated with viscous flux and the solder ball 160 is positioned on the flux. Then, when a semiconductor die is put into a furnace of 150 to 250 degrees Celsius and is taken out, the flux is volatilized and removed and the spherical solder ball 160 is welded to the first UBM layer 151. Here, the solder ball 160 can be a common Sn—Ag—Cu alloy, but the material of the solder ball 160 is not limited thereto.

FIGS. 7A to 7D are sectional views sequentially illustrating a method of manufacturing WLCSP according to another embodiment of the present invention.

Figure 7A:
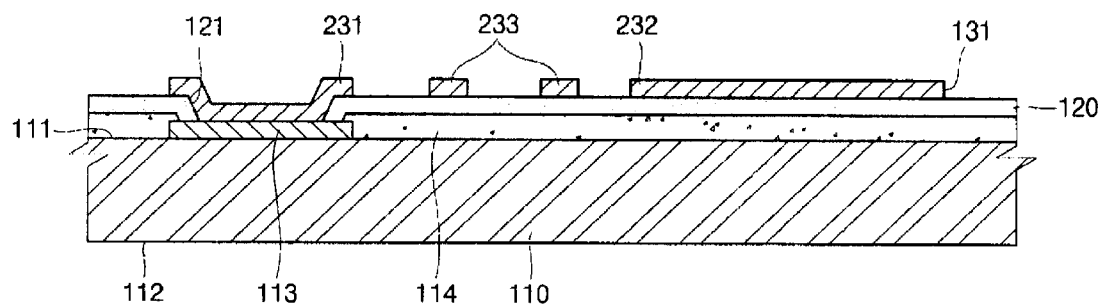
FIGS. 7A, 7B, 7C, 7D are sectional views sequentially illustrating a method of manufacturing a WLCSP according to another embodiment of the present invention.

As illustrated in FIG. 7A, operations S1, s2 are performed as discussed above, and in the form redistribution layers operation S3, the first redistribution layer 231 and the second redistribution layer 232 that are physically separated from each other are formed on the first dielectric layer 120. That is, one end of the first redistribution layer 231 is connected to the bond pad 113 and the land 131 is provided at one end of the second redistribution layer 232. A third redistribution layer 233 can be formed between the first and second redistribution layers 231 and 232. The first and second redistribution layers 231 and 232 are not electrically connected to the third redistribution layer 233.

Figure 7B:
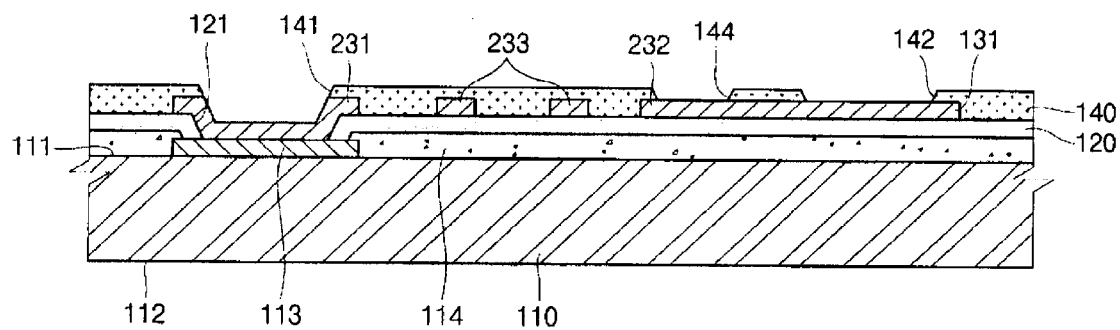

As illustrated in FIG. 7B, in the form second dielectric layer operation S4, the first dielectric layer 120, the first and second redistribution layers 231 and 232, and the third redistribution layer 233 are covered with the second dielectric layer 140. In this case, the opening 142 is formed in the region of the second dielectric layer 140 corresponding to the land 131 such that the land 131 is exposed to the outside. The via-hole 144 is formed in the region of the second dielectric layer 140 corresponding to the second redistribution layer 232 connected to the land 131 such that a desired region of the second redistribution layer 232 is exposed to the outside. Furthermore, the opening 141 is formed in the region of the second dielectric layer 140 corresponding to the first redistribution layer 231 and the bond pad 113 such that a desired region of the first redistribution layer 231 is exposed.

Figure 7C:
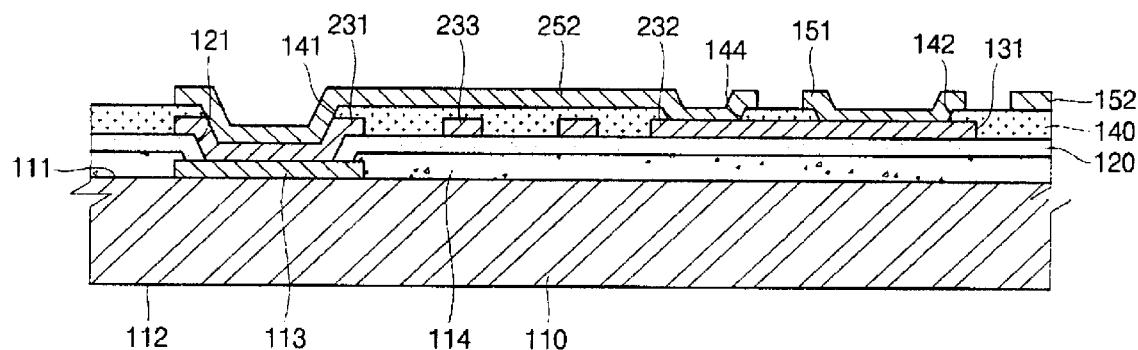

As illustrated in FIG. 7C, in the form first and second UBM layers operation S5, the first UBM layer 151 is formed on the land 131 exposed through the opening 142 and the second UBM layer 252 is simultaneously formed on the outer circumference of the first UBM layer 151. That is, the second UBM layer 252 is configured such that one end thereof is connected to the first redistribution layer 231 through the opening 141 in the region corresponding to the bond pad 113 and the other end thereof is connected to the second redistribution layer 232 through the via-hole 144. By doing so, the second UBM layer 252 electrically connects the first and second redistribution layers 231 and 232 to each other. When the bond pad 113 is a ground terminal, the solder ball formed on the first UBM layer 151 serves as GROUND. When the bond pad 113 is a power terminal, the solder ball formed on the first UBM layer 151 serves as POWER.

Figure 7D:
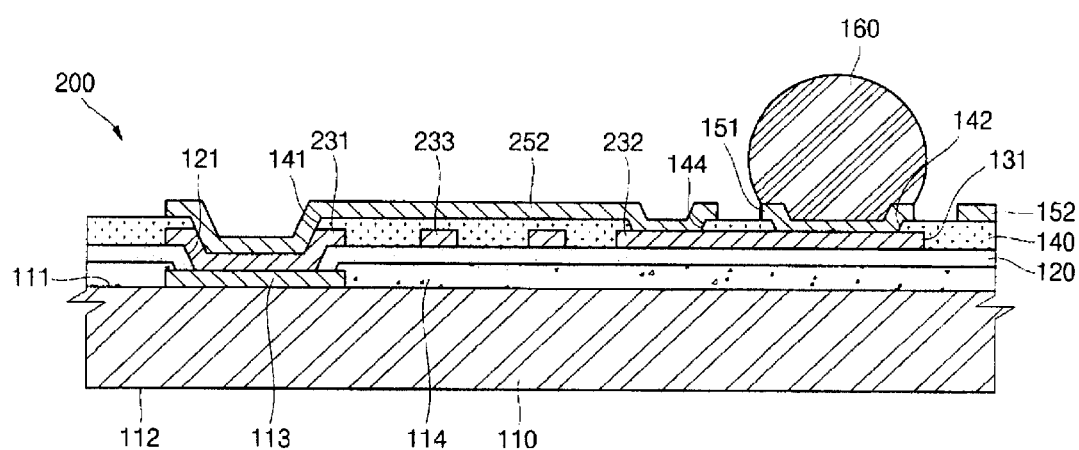

As illustrated in FIG. 7D, in the reflow solder ball operation S6, the solder ball 160 of a preset size is welded to the first UBM layer 151 to complete the WLCSP 200 according to another embodiment of the present invention.

Figure 8A:
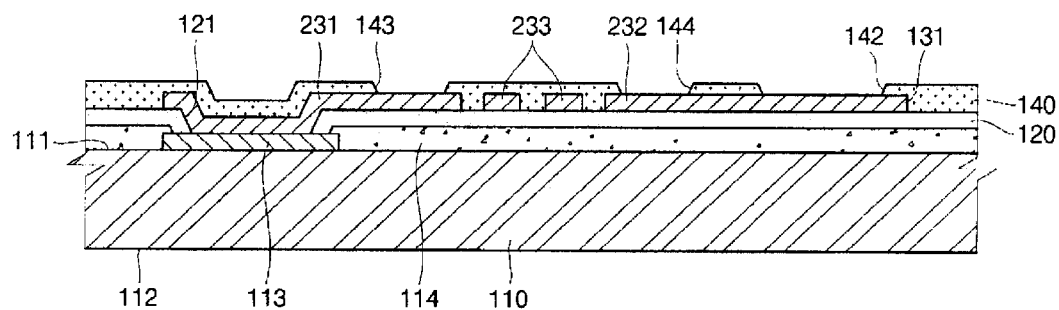
FIGS. 8A, 8B, 8C are sectional views sequentially illustrating a method of manufacturing a WLCSP according to still another embodiment of the present invention.
Figure 8B:
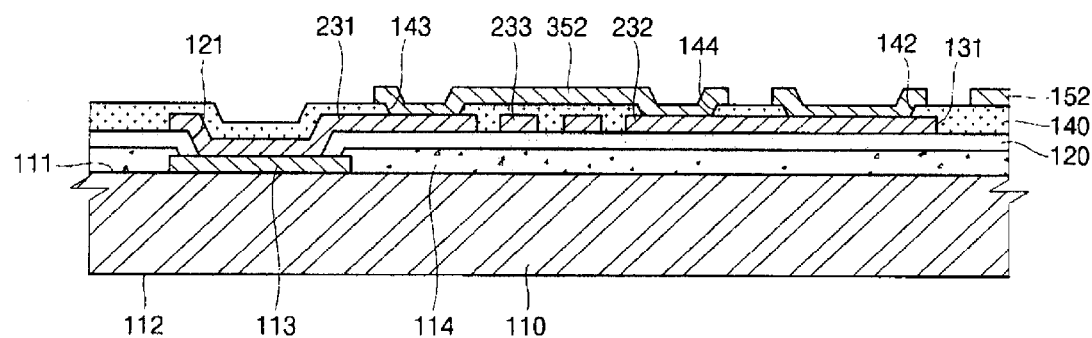
Figure 8C:
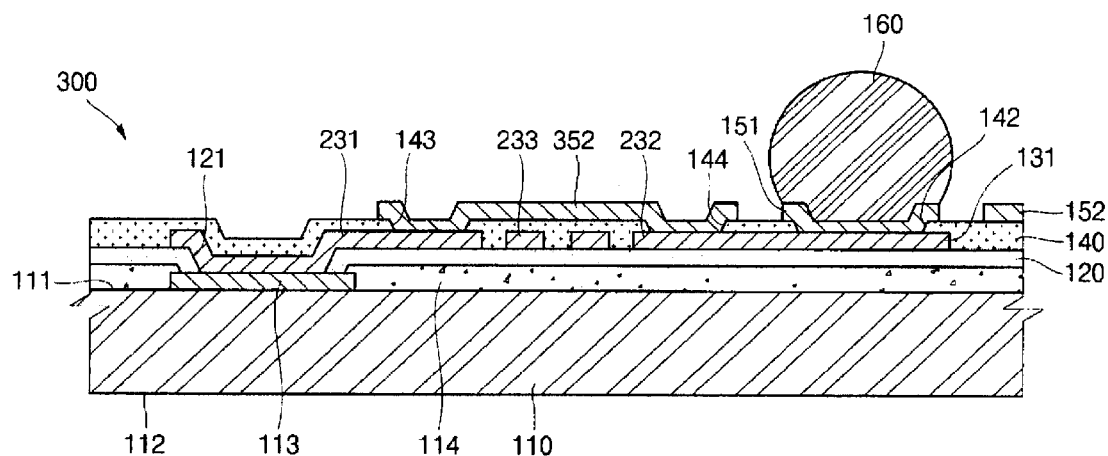

FIGS. 8A to 8C are sectional views sequentially illustrating a method of manufacturing a WLCSP according to still another embodiment of the present invention.

As illustrated in FIG. 8A, operations S1, S2, S3 are performed in a manner similar to that discussed above, and in the form second dielectric layer operation S4, a first dielectric layer 120, first and second redistribution layers 231 and 232, and a third redistribution layer 233 are covered with a second dielectric layer 140. In this case, an opening 142 is formed in the region of the second dielectric layer 140 corresponding to a land 131 such that the land 131 is exposed to the outside. In addition, via-holes 143 and 144 are formed in the regions of the second dielectric layer 140 corresponding to the first redistribution layer 231 connected to a bond pad 113 and the second redistribution layer 232 connected to the land 131, respectively, such that desired regions of the first and second redistribution layers 231 and 232 are exposed to the outside.

As illustrated in FIG. 8B, in the form first and second UBM layers operation S5, a first UBM layer 151 is formed on the land 131 exposed through the opening 142, a second UBM layer 352 is simultaneously formed on the outer circumference of the first UBM layer 151, and a second UBM layer 152 is formed. That is, the second UBM layer 352 is configured such that one end thereof is connected to the first redistribution layer 231 through the via-hole 143 and the other end thereof is connected to the second redistribution layer 232 through the via-hole 144. By doing so, the second UBM layer 352 electrically connects the first and second redistribution layers 231 and 232 to each other. The second UBM layer 152 is linear on a plane. That is, the second UBM layer 152 is in the form of a wide surface on a plane, however, the second UBM layer 352 is in the form of a narrow and small line since the second UBM layer 352 serves as a wiring line. In other words, the second UBM layer 352 has two signal wiring lines crossing each other without being shorted with each other rather than serving as GROUND or POWER. That is, the second UBM layer 352 exhibits a multilayer redistribution layer.

As illustrated in FIG. 8C, in the reflow solder ball operation S6, a solder ball 160 of a preset size is welded to the first UBM layer 151 to complete the WLCSP 300 according to still another embodiment of the present invention.

Figure 9A:
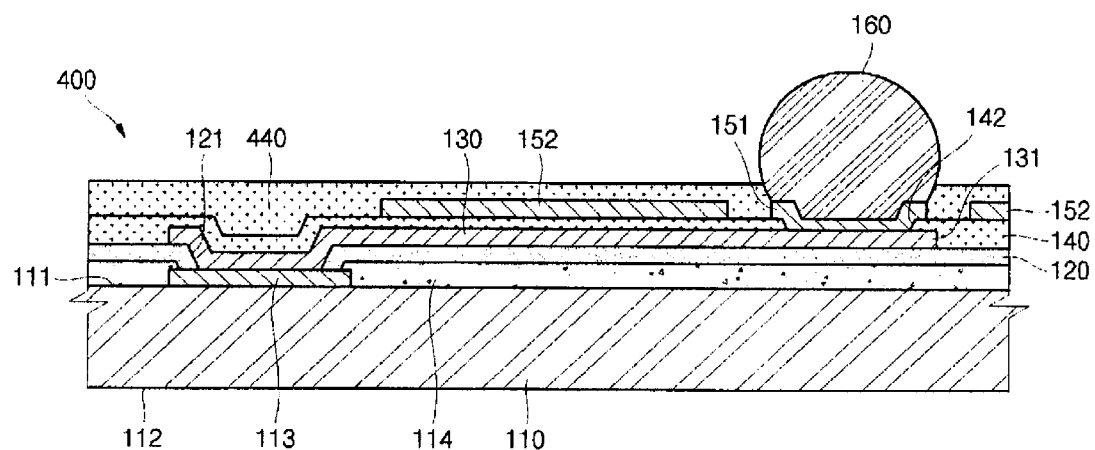
FIGS. 9A and 9B are sectional views illustrating a WLCSP according to another embodiment of the present invention.
Figure 9B:
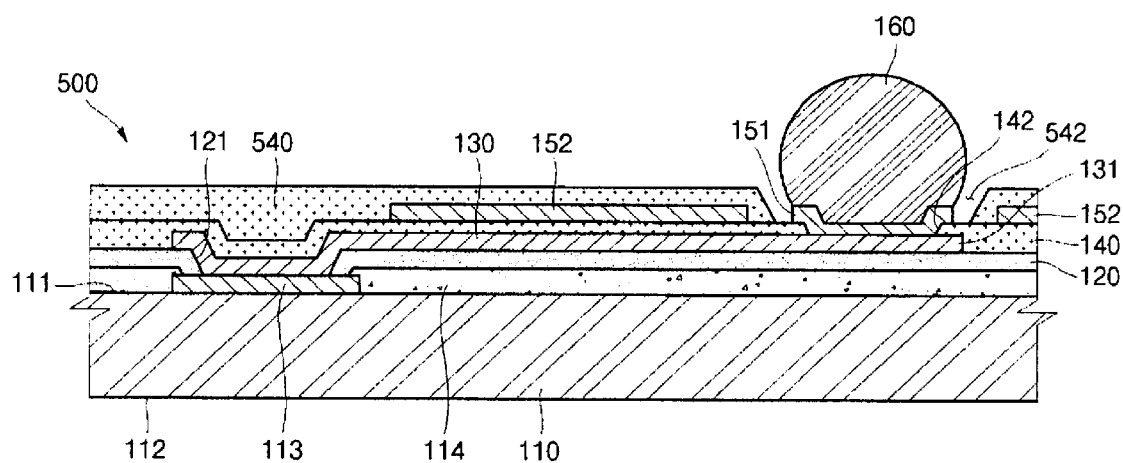

Referring to FIGS. 9A and 9B, sectional views of a WLCSP according to another embodiment of the present invention are illustrated.

As illustrated in FIG. 9A, a WLCSP 400 according to another embodiment of the present invention is similar to the above-described WLCSP 100. Therefore, only a difference between the two WLCSPs will be described.

The WLCSP 400 according to another embodiment of the present invention further includes a third dielectric layer 440 formed on the second dielectric layer 140 and the second UBM layer 152 to a preset thickness. The third dielectric layer 440 covers the side surfaces of the first UBM layer 151 and the solder ball 160. In other words, the WLCSP 400 is a solder mask defined (SMD) type. In other words, the third dielectric layer 440 can be formed of one selected from the group of PolyImide (PI), Benzo Cyclo Butene (BCB), Poly Benz Oxazole (PBO), BismaleimideTriazine (BT), phenolic resin, epoxy, silicone, an oxide layer ($SiO_2$), a nitride layer ($Si_3N_4$), and their equivalents, but the material of the third dielectric layer 440 is not limited thereto.

The third dielectric layer 440 can be generally formed by photolithographing and etching after forming the first and second UBM layers 151 152. That is, the third dielectric layer 440 can be formed before forming the solder ball 160.

By doing so, the WLCSP 400 according to another embodiment of the present invention prevents the first and second UBM layers 151 and 152 from undesired electrical shorting with each other. In the WLCSP 400 according to another embodiment of the present invention, the distance between the first and second UBM layers 151 and 152 can be remarkably reduced.

On the other hand, as illustrated in FIG. 9B, a WLCSP 500 according to still another embodiment of the present invention can be in a non-solder mask defined (NSMD) type unlike the above-described WLCSP 400. That is, a clearance 542 can be formed between the third dielectric layer 540 and the first UBM layer 151. In other words, the third dielectric layer 540 is spaced away from the first UBM layer 151. When the NSMD is used in the WLCSP 500, optimum reliability is achieved, and thus due to lower stress concentration to a joint, a longer life can be achieved.

Figure 10A:
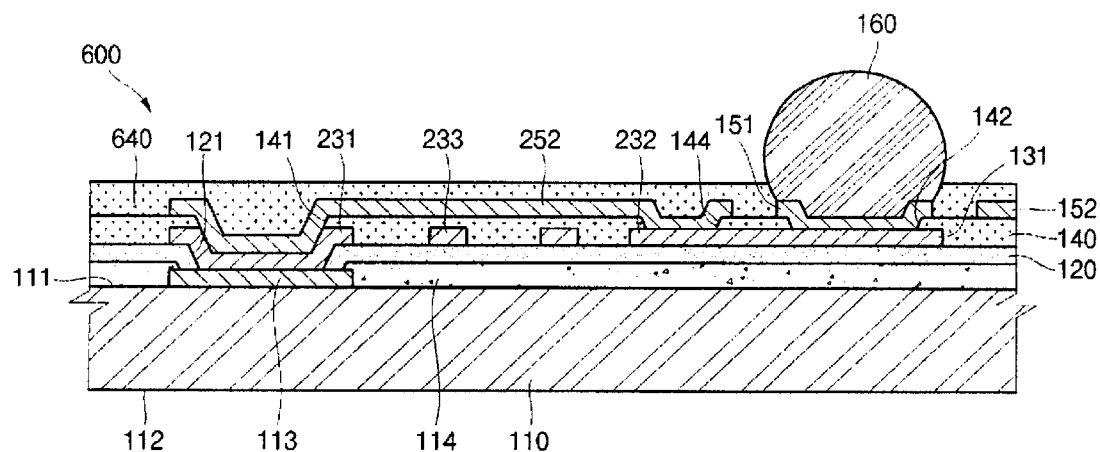
FIGS. 10A and 10B are sectional views illustrating a WLCSP according to still another embodiment of the present invention.
Figure 10B:
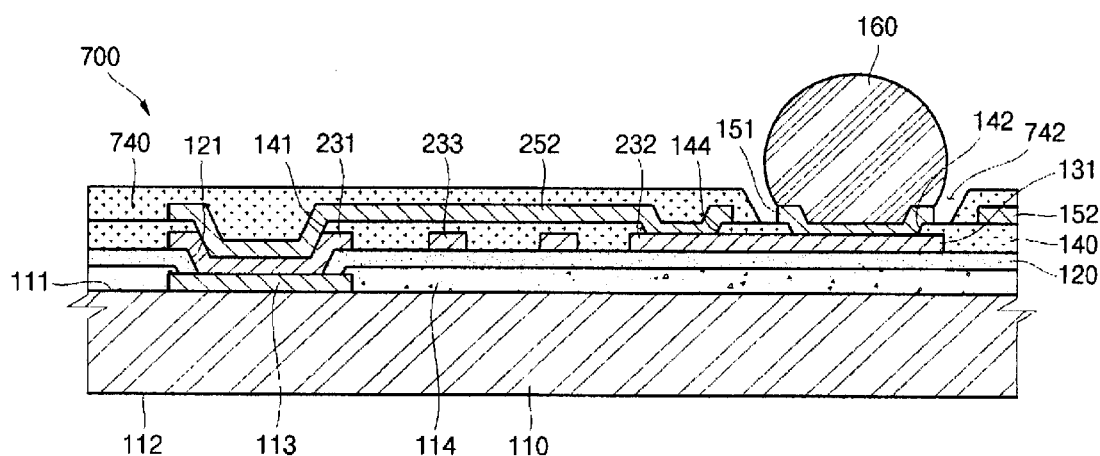

Referring to FIGS. 10A and 10B, sectional views of a WLCSP according to still another embodiment of the present invention are illustrated.

As illustrated in FIG. 10A, a WLCSP 600 according to still another embodiment of the present invention is similar to the above-described WLCSP 200. Therefore, only a difference between the two WLCSPs will be described.

The WLCSP 600 according to still another embodiment of the present invention further includes a third dielectric layer 640 formed on the second dielectric layer 140 and the second UBM layers 152 and 252 to a preset thickness. The third dielectric layer 640 covers the side surfaces of the first UBM layer 151 and the solder ball 160. In other words, the WLCSP 600 is the SMD type. The third dielectric layer 640 can be formed of one selected from the group of PolyImide (PI), Benzo Cyclo Butene (BCB), Poly Benz Oxazole (PBO), BismaleimideTriazine (BT), phenolic resin, epoxy, silicone, an oxide layer ($SiO_2$), a nitride layer ($Si_3N_4$), and their equivalents thereof, but the material of the third dielectric layer 640 is not limited thereto.

The third dielectric layer 640 can be generally formed by photolithographing and etching after forming the first UBM layer 151 and the second UBM layers 152 and 252. That is, the third dielectric layer 640 can be formed before forming the solder ball 160.

By doing so, the WLCSP 600 according to still another embodiment of the present invention prevents the first UBM layer 151 and the second UBM layers 152 and 252 from undesired electrical shorting with each other. In the WLCSP 600 according to still another embodiment of the present invention, the distance between the first UBM layer 151 and the second UBM layers 152 and 252 can be remarkably reduced.

On the other hand, as illustrated in FIG. 10B, a WLCSP 700 according to still another embodiment of the present invention can be the NSMD type unlike the above-described WLCSP 600. That is, a clearance 742 can be formed between a third dielectric layer 740 and the first UBM layer 151. In other words, the third dielectric layer 740 is spaced away from the first UBM layer 151. When the NSMD is used in the WLCSP 700, optimum reliability is achieved, and thus due to lower stress concentration to a joint, a longer life can be achieved.

Figure 11A:
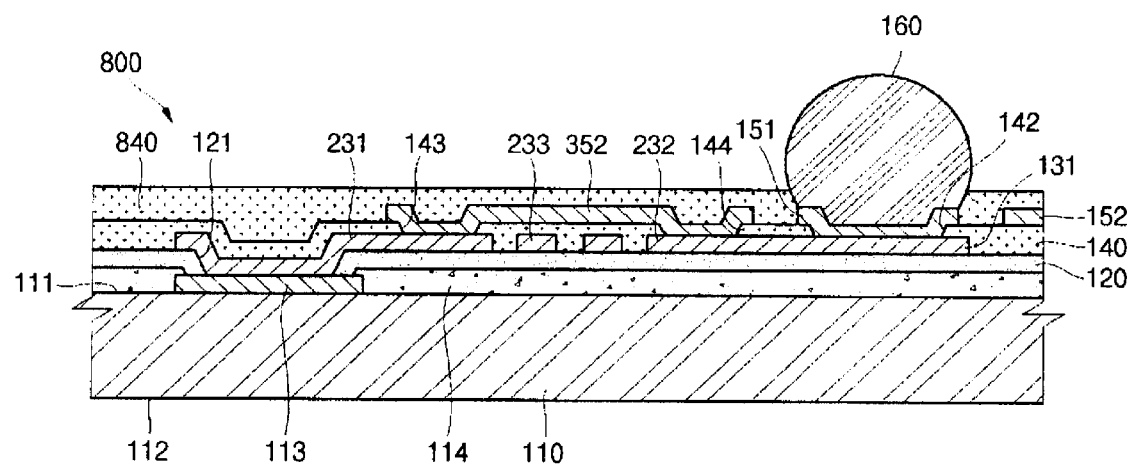
FIGS. 11A and 11B are sectional views illustrating a WLCSP according to still another embodiment of the present invention.
Figure 11B:
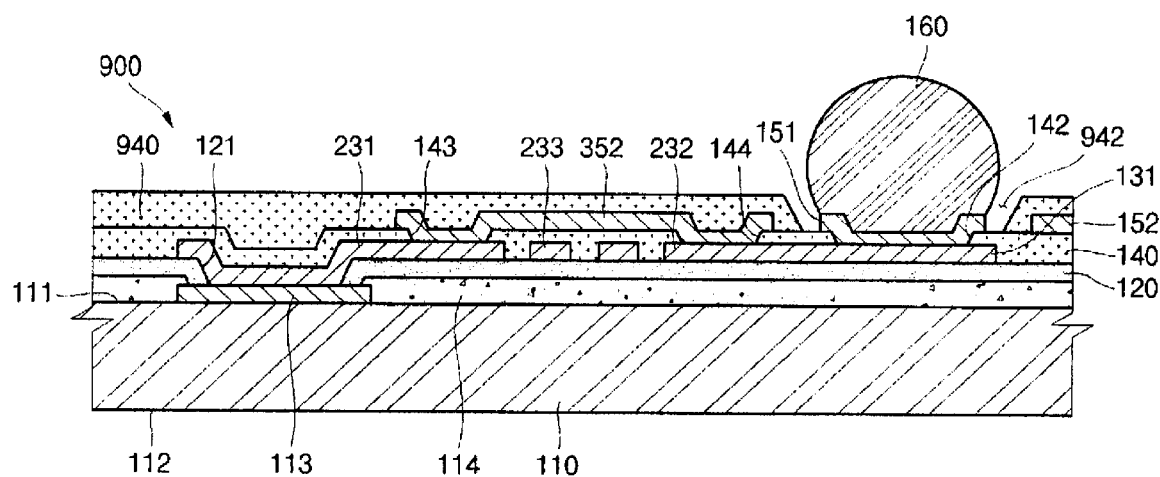

Referring to FIGS. 11A and 11B, sectional views of a WLCSP according to still another embodiment of the present invention are illustrated.

As illustrated in FIG. 11A, a WLCSP 800 according to still another embodiment of the present invention is similar to the above-described WLCSP 300. Therefore, only a difference between the two WLCSPs will be described.

The WLCSP 800 according to still another embodiment of the present invention further includes a third dielectric layer 840 formed on the second dielectric layer 140 and the second UBM layers 152 and 352 to a preset thickness. The third dielectric layer 840 covers the side surfaces of the first UBM layer 151 and the solder ball 160. In other words, the WLCSP 800 is the SMD type. The third dielectric layer 840 can be formed of one selected from the group of PolyImide (PI), Benzo Cyclo Butene (BCB), Poly Benz Oxazole (PBO), BismaleimideTriazine (BT), phenolic resin, epoxy, silicone, an oxide layer ($SiO_2$), a nitride layer ($Si_3N_4$), and their equivalents, but the material of the third dielectric layer 840 is not limited thereto.

The third dielectric layer 840 can be generally formed by photolithographing and etching after forming the first UBM layer 151 and the second UBM layers 152 and 352. That is, the third dielectric layer 840 can be formed before forming the solder ball 160.

By doing so, the WLCSP 800 according to still another embodiment of the present invention prevents the first UBM layer 151 and the second UBM layers 152 and 352 from undesired electrical shorting with each other. In the WLCSP 800 according to still another embodiment of the present invention, the distance between the first UBM layer 151 and the second UBM layers 152 and 352 can be remarkably reduced.

On the other hand, as illustrated in FIG. 11B, a WLCSP 900 according to still another embodiment of the present invention can be the NSMD type unlike the above-described WLCSP 800. That is, a clearance 942 can be formed between a third dielectric layer 940 and the first UBM layer 151. In other words, the third dielectric layer 940 is spaced away from the first UBM layer 151. When the NSMD is used in the WLCSP 900, optimum reliability is achieved, and thus due to lower stress concentration to a joint, a longer life can be achieved.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process, may be implemented by one skilled in the art in view of this disclosure.

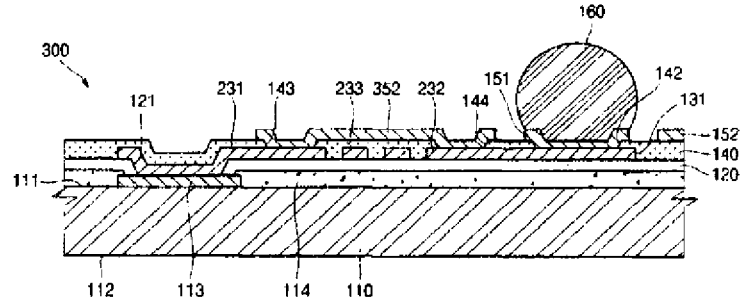

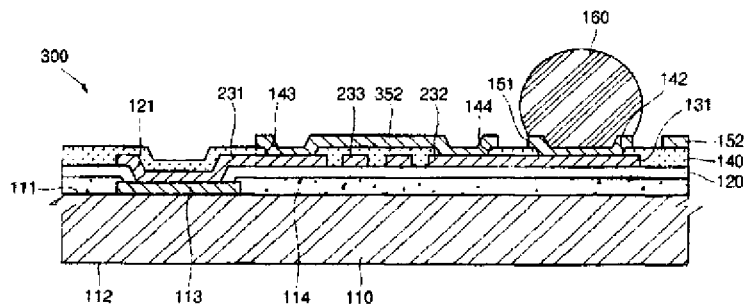

What is claimed is:

1. A wafer level chip size package, comprising:
   a semiconductor die comprising:
      a bond pad; and
      a passivation layer formed on an outer circumference of the bond pad;
   a first dielectric layer covering the passivation layer, the first dielectric layer comprising a first opening exposing the bond pad;
   a first redistribution layer formed on the first dielectric layer, the first redistribution layer being connected to the bond pad through the first opening;
   a second redistribution layer comprising a land, wherein the first redistribution layer is physically separated from the second redistribution layer on the first dielectric layer;
   a second dielectric layer covering the first redistribution layer and the second redistribution layer, the second dielectric layer comprising:
      a first redistribution layer opening exposing the first redistribution layer;
      a land opening exposing the land; and
      a via-hole exposing the second redistribution layer;
   a first Under Bump Metallurgy (UBM) layer formed on the land through the land opening;
   a second Under Bump Metallurgy (UBM) layer formed on the second dielectric layer, the second UBM layer connected to the first redistribution layer through the first redistribution layer opening and to the second redistribution layer through the via hole; and
   a solder ball on the first UBM layer.

2. The wafer level chip size package of claim 1, further comprising a third redistribution layer formed below the second UBM layer and on the first dielectric layer.

3. A wafer level chip size package, comprising:
   a semiconductor die comprising:
      a bond pad; and
      a passivation layer formed on an outer circumference of the bond pad;
   a first dielectric layer covering the passivation layer, the first dielectric layer comprising a first opening exposing the bond pad;
   a first redistribution layer formed on the first dielectric layer, the first redistribution layer being connected to the bond pad through the first opening;
   a second redistribution layer comprising a land;
   a second dielectric layer covering the first redistribution layer and the second redistribution layer, the second dielectric layer comprising:
      a first redistribution layer opening exposing the first redistribution layer;
      a land opening exposing the land; and
      a via-hole exposing the second redistribution layer;
   a first Under Bump Metallurgy (UBM) layer formed on the land through the land opening;
   a second Under Bump Metallurgy (UBM) layer formed on the second dielectric layer, the second UBM layer connected to the first redistribution layer through the first redistribution layer opening and to the second redistribution layer through the via hole;
   a third redistribution layer formed below the second UBM layer and on the first dielectric layer, wherein the third redistribution layer is electrically isolated from the first redistribution layer and the second redistribution layer; and
   a solder ball on the first UBM layer.

4. The wafer level chip size package of claim 2, wherein the second dielectric layer is between the third redistribution layer and the second UBM layer.

5. A wafer level chip size package, comprising:
   a semiconductor die comprising
      a bond pad; and
      a passivation layer formed on an outer circumference of the bond pad;
   a first dielectric layer covering the passivation layer, the first dielectric layer comprising a first opening exposing the bond pad;
   a first redistribution layer formed on the first dielectric layer, the first redistribution layer being connected to the bond pad through the first opening;
   a second redistribution layer comprising a land;
   a second dielectric layer covering the first redistribution layer and the second redistribution layer, the second dielectric layer comprising:
      a first redistribution layer opening exposing the first redistribution layer;
      a land opening exposing the land; and
      a via-hole exposing the second redistribution layer;
   a first Under Bump Metallurgy (UBM) layer formed on the land through the land opening;
   a second Under Bump Metallurgy (UBM) layer formed, on the second dielectric layer, the second UBM layer connected to the first redistribution layer through the first redistribution layer opening and to the second redistribution layer through the via hole;
   a third redistribution layer formed below the second UBM layer and on the first dielectric layer, wherein the second dielectric layer electrically isolates the third redistribution layer from the second UBM layer; and
   a solder ball on the first UBM layer.

6. The wafer level chip size package of claim 1 wherein the first redistribution layer opening is formed directly over an extension of the first redistribution layer.

7. A wafer level chip size package comprising:
   a semiconductor die comprising a bond pad;
   a first dielectric layer comprising a first opening exposing the bond pad;
   a first redistribution layer coupled to the bond pad through the first opening;
   a second redistribution layer;
   a second dielectric layer covering the first redistribution layer and the second redistribution layer, the second dielectric layer comprising:
      a first redistribution layer opening exposing the first redistribution layer; and
      a via-hole exposing the second redistribution layer;

a first Under Bump Metallurgy (UBM) layer formed on the second redistribution layer;

a second Under Bump Metallurgy (UBM) layer formed on the second dielectric layer, the second UBM layer connected to the first redistribution layer through the first redistribution layer opening and to the second redistribution layer through the via-hole; and a third redistribution layer formed below the second UBM layer and on the first dielectric layer, wherein the third redistribution layer is electrically isolated from the first redistribution layer and the second redistribution layer.

8. The wafer level chip size package of claim 7, wherein the second dielectric layer is between the third redistribution layer and the second UBM layer.

9. A wafer level chip size package comprising:
a semiconductor die comprising a bond pad;
a first dielectric layer comprising a first opening exposing the bond pad;
a first redistribution layer coupled to the bond pad through the first opening;
a second redistribution layer;
a second dielectric layer covering the first redistribution layer and the second redistribution layer, the second dielectric layer comprising:
 a first redistribution layer opening exposing the first redistribution layer; and
 a via-hole exposing the second redistribution layer;
a first Under Bump Metallurgy (UBM) layer formed on the second redistribution layer;
a second Under Bump Metallurgy (UBM) layer formed on the second dielectric layer, the second UBM layer connected to the first redistribution layer through the first redistribution layer opening and to the second redistribution layer through the via-hole; and
a third redistribution layer formed below the second UBM layer and on the first dielectric layer, wherein the second dielectric layer electrically isolates the third redistribution layer from the second UBM layer.

10. The wafer level chip size package of claim 7 wherein the first redistribution layer comprises an extension.

11. The wafer level chip size package of claim 10 wherein the second UBM layer is connected to the extension through the first redistribution layer opening.

12. The wafer level chip size package of claim 7 wherein the second redistribution layer comprises a land and the first UBM layer is formed on the land.

13. The wafer level chip size package of claim 12 wherein the second dielectric layer further comprises a land opening exposing the land.

14. The wafer level chip size package of claim 7 further comprising a solder ball on the first UBM layer.

15. A wafer level chip size package comprising:
a semiconductor die comprising a bond pad;
a first dielectric layer;
a first redistribution layer comprising an extension, the first redistribution layer being formed on the first dielectric layer and being connected to the bond pad through a first opening in the first dielectric layer;
a second redistribution layer comprising a land, the second redistribution layer being formed on the first dielectric layer;
a third redistribution layer formed on the first dielectric layer;
a second dielectric layer covering the first redistribution layer, the second redistribution layer, and the third redistribution layer, the second dielectric layer comprising a land opening exposing the land;
a first Under Bump Metallurgy (UBM) layer formed on the land through the land opening;
a second Under Bump Metallurgy (UBM) layer formed on the second dielectric layer, the second UBM layer connecting the extension to the second redistribution layer above the third redistribution layer, wherein the second dielectric layer is between the third redistribution layer and the second UBM layer and electrically isolates the third redistribution layer from the second UBM layer; and
a solder ball on the first UBM layer.

16. A wafer level chip size package comprising
a semiconductor die comprising a bond pad;
a first dielectric layer;
a first redistribution layer comprising an extension, the first redistribution layer being formed on the first dielectric layer and being connected to the bond pad through a first opening in the first dielectric layer;
a second redistribution layer comprising a land, the second redistribution layer being formed on the first dielectric layer;
a third redistribution layer formed on the first dielectric layer;
a second dielectric layer covering the first redistribution layer, the second redistribution layer, and the third redistribution layer, the second dielectric layer comprising a land opening exposing the land;
a first Under Bump Metallurgy (UBM) layer formed on the land through the land opening;
a second Under Bump Metallurgy (UBM) layer formed on the second dielectric layer, the second UBM layer connecting the extension to the second redistribution layer above the third redistribution layer, wherein the second dielectric layer further comprises:
 a first redistribution layer opening exposing the extension; and
 a via-hole exposing the second redistribution layer, wherein the second UBM layer connects to the extension through the first redistribution layer opening and to the second redistribution layer through the via-hole; and
a solder ball on the first UBM layer.

* * * * *

UNITED STATES PATENT AND TRADEMARK OFFICE
CERTIFICATE OF CORRECTION

| | | |
|---|---|---|
| PATENT NO. | : 7,977,783 B1 | Page 1 of 1 |
| APPLICATION NO. | : 12/549083 | |
| DATED | : July 12, 2011 | |
| INVENTOR(S) | : No Sun Park, Young Suk Chung and Jae Beom Shim | |

It is certified that error appears in the above-identified patent and that said Letters Patent is hereby corrected as shown below:

In Column 12, Line 42, Claim 5, between "formed" and "on", delete ",";
In Column 14, Line 23, Claim 16, after "comprising", insert --:--;
In Column 14, after the last line, insert the following Claim 17:
   --17. The wafer level chip size package of claim 1 wherein the first redistribution layer opening is formed directly over the bond pad.--

Signed and Sealed this
Tenth Day of July, 2012

David J. Kappos
*Director of the United States Patent and Trademark Office*

UNITED STATES PATENT AND TRADEMARK OFFICE
CERTIFICATE OF CORRECTION

PATENT NO. : 7,977,783 B1  
APPLICATION NO. : 12/549083  
DATED : July 12, 2011  
INVENTOR(S) : No Sun Park, Young Suk Chung and Jae Beom Shim Page 1 of 2

It is certified that error appears in the above-identified patent and that said Letters Patent is hereby corrected as shown below:

Delete the title page and substitute therefore the attached Title page showing the corrected number of claims in patent.

In Column 12, Line 42, Claim 5, between "formed" and "on", delete ",";
In Column 14, Line 23, Claim 16, after "comprising", insert --:--;
In Column 14, after the last line, insert the following Claim 17:
   --17. The wafer level chip size package of claim 1 wherein the first redistribution layer opening is formed directly over the bond pad.--

This certificate supersedes the Certificate of Correction issued July 10, 2012.

Signed and Sealed this
Fourteenth Day of August, 2012

David J. Kappos
*Director of the United States Patent and Trademark Office*

(12) United States Patent
Park et al.

(10) Patent No.: US 7,977,783 B1
(45) Date of Patent: Jul. 12, 2011

(54) WAFER LEVEL CHIP SIZE PACKAGE HAVING REDISTRIBUTION LAYERS

(75) Inventors: No Sun Park, Seoul (KR); Young Suk Chung, Seoul (KR); Jae Beom Shim, Incheon (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/549,083

(22) Filed: Aug. 27, 2009

(51) Int. Cl.
*H01L 23/48* (2006.01)

(52) U.S. Cl. ........ 257/692; 257/E29.325; 257/E23.023; 257/E23.124; 257/E23.069; 257/737; 257/738

(58) Field of Classification Search ........... 257/692, 257/737, 738, E29.325, E23.023, E23.124, 257/E23.069
See application file for complete search history.

(56) References Cited

U.S. PATENT DOCUMENTS

| | | | |
|---|---|---|---|
| 7,211,893 B2* | 5/2007 | Alter et al. | 257/738 |
| 7,466,031 B2 | 12/2008 | Huang | |
| 7,468,545 B2* | 12/2008 | Lin et al. | 257/622 |
| 7,701,056 B2* | 4/2010 | Su | 257/737 |
| 7,767,496 B2* | 8/2010 | Shim et al. | 438/118 |
| 2005/0121770 A1* | 6/2005 | Baek et al. | 257/698 |
| 2006/0226542 A1* | 10/2006 | Chien et al. | 257/737 |
| 2007/0152327 A1* | 7/2007 | Chia et al. | 257/723 |
| 2007/0176290 A1* | 8/2007 | Park et al. | 257/737 |
| 2007/0296065 A1* | 12/2007 | Yew et al. | 257/659 |
| 2008/0042259 A1* | 2/2008 | Yamaguchi | 257/700 |
| 2008/0211093 A1* | 9/2008 | Ke et al | 257/738 |
| 2009/0057895 A1* | 3/2009 | Lin et al. | 257/737 |

* cited by examiner

*Primary Examiner* — Alexander O Williams

(74) *Attorney, Agent, or Firm* — Gunnison, McKay & Hodgson, L.L.P.; Serge J. Hodgson

(57) ABSTRACT

A wafer level chip size package (WLCSP) and a method of manufacturing the same are disclosed. Lands are formed at the ends of redistribution layers. The redistribution layers excluding the lands and a first dielectric layer are covered with a second dielectric layer. After forming a first under bump metallurgy (UBM) layer on the land, a solder ball is reflowed to the first UBM layer. A second UBM layer is widely formed on the entire second dielectric layer that is the outer circumference of the first UBM layer and is connected to the redistribution layer through a via-hole. Therefore, the second UBM layer having a large area can be used as a ground plane or a power plane. In addition, the second UBM layer can electrically connect the redistribution layers physically separated from each other. Therefore, the plurality of redistribution layers can cross each other without being electrically shorted with each other.

17 Claims, 13 Drawing Sheets